(12) United States Patent
Miyamoto (10) Patent No.: US 7,460,425 B2
(45) Date of Patent: Dec. 2, 2008

(54) MEMORY HAVING COUNT DETECTION CIRCUITRY FOR DETECTING ACCESS FREQUENCY

(75) Inventor: Hideaki Miyamoto, Ogaki (JP)

(73) Assignee: Sanyo Electric co., Ltd., Osaka (JP)

( * ) Notice: Subject to any disclaimer, the term of this patent is extended or adjusted under 35 U.S.C. 154(b) by 17 days.

(21) Appl. No.: 11/656,480

(22) Filed: Jan. 23, 2007

(65) Prior Publication Data

US 2007/0183242 A1 Aug. 9, 2007

(30) Foreign Application Priority Data

Jan. 23, 2006 (JP) ............................. 2006-013351

(51) Int. Cl.
*G11C 7/00* (2006.01)

(52) U.S. Cl. .................. 365/222; 365/236; 365/241

(58) Field of Classification Search ................ 365/222, 365/236, 241
See application file for complete search history.

(56) References Cited

U.S. PATENT DOCUMENTS

| | | | |
|---|---|---|---|
| 4,617,564 A * | 10/1986 | Yoshioka | 345/534 |
| 5,487,029 A | 1/1996 | Kuroda et al. | |
| 5,550,770 A | 8/1996 | Kuroda | |
| 5,907,483 A * | 5/1999 | Iio et al. | 363/58 |
| 6,720,096 B1 | 4/2004 | Matsushita et al. | |
| 2003/0179610 A1 | 9/2003 | Sakai | |
| 2007/0237016 A1 * | 10/2007 | Miyamoto et al. | 365/222 |

FOREIGN PATENT DOCUMENTS

| | | |
|---|---|---|
| JP | 06-077434 | 3/1994 |
| JP | 07-073682 | 3/1995 |
| JP | 10-162588 A | 6/1998 |
| JP | 2000-235789 | 8/2000 |
| JP | 2001-210795 | 8/2001 |
| JP | 2002-343078 | 11/2002 |
| JP | 2003-00751 | 1/2003 |
| JP | 2004-047045 | 2/2004 |

OTHER PUBLICATIONS

H. Hada. "Process for ferroelectric random access memory (FeRAM)", FED Review, Mar. 14, 2002, p. 1-7, vol. 1. No. 22.

* cited by examiner

*Primary Examiner*—Thong Q Le
(74) *Attorney, Agent, or Firm*—McDermott Will & Emery LLP (57) ABSTRACT

A memory capable of suppressing increase in circuit size, reduction in a period for an original access and increase in power consumption while suppressing an imprint can be obtained. The memory includes a first count detection circuit for detecting an access frequency with respect to memory cells, a second count detection circuit for detecting an access frequency of each of memory cell blocks and a third count detection circuit detecting a no-access frequency resulting in an imprint.

17 Claims, 5 Drawing Sheets

MEMORY HAVING COUNT DETECTION CIRCUITRY FOR DETECTING ACCESS FREQUENCY

BACKGROUND OF THE INVENTION

1. Field of the Invention

The present invention relates to a memory, and more particularly, it relates to a memory refreshing stored data.

2. Description of the Background Art

A ferroelectric memory (FeRAM: ferroelectric random-access memory) is generally known as an exemplary nonvolatile memory. The ferroelectric memory utilizes pseudo-capacitance change responsive to the direction of polarization of a ferroelectric substance as a memory element. The ferroelectric memory is exceedingly excellent in high data-rewriting rate and low power consumption as compared with a flash memory being a typical example of a conventional nonvolatile memory, and is expected as a next-generation nonvolatile memory.

In the ferroelectric memory, however, when leaving the ferroelectric memory, in which data is written, for a long time, a hysteresis curve is shifted in a positive or negative direction (horizontal direction), whereby an imprint, in which a quantity of polarization is gradually reduced over time, disadvantageously occurs as a characteristic of the ferroelectric substance. Therefore, when the imprint occurs, the quantity of the polarization written in the ferroelectric memory as data is reduced over time. Thus, when the quantity of the polarization is reduced to not more than a quantity necessary for reading data, the ferroelectric memory can not disadvantageously function as a memory.

Japanese Patent Laying-Open No. 10-162588 (1998) discloses a memory capable of suppressing an imprint. This memory measures time by a timer, accesses at least all memory cells in which data is written upon a lapse of a prescribed time, and writes data having an opposite polarity to the data held. Thereafter, original data is rewritten again, whereby an imprint is suppressed.

The memory disclosed in Japanese Patent Laying-Open No. 10-162588 (1998), however, must be disadvantageously provided with the timer for performing a measurement for a long time in order to measure the time of access for preventing an imprint with respect to the memory cells. Therefore, circuit size is disadvantageously increased. Additionally, the access must be performed with respect to the all memory cells each prescribed time measured by the timer. Thus, a period for an original access of the memory is disadvantageously shortened, and power consumption of the memory is disadvantageously increased.

SUMMARY OF THE INVENTION

The present invention has been proposed in order to solve the aforementioned problem, and an object of the present invention is to provide a memory capable of suppressing increase in circuit size, reduction in a period for an original access and increase in power consumption while suppressing an imprint.

A memory according to an aspect of the present invention comprises a plurality of memory cell blocks each including a plurality of memory cells, a refresh control circuit for performing a read operation and a rewrite operation with respect to the memory cells, a first count detection circuit for detecting an access frequency with respect to the memory cells, a second count detection circuit for detecting an access frequency of each memory cell block, and a third count detection circuit detecting a frequency in which the sum of access frequencies of each memory cell block counted by the second count detection circuit has not reached a prescribed frequency when the first count detection circuit detects that the sum of access frequencies with respect to the memory cells reaches a prescribed frequency.

As hereinabove described, the memory according to the aspect of the present invention comprises the third count detection circuit detecting the frequency in which the sum of the access frequencies of each memory cell block counted by the second count detection circuit has not reached the prescribed frequency when the first count detection circuit detects that the sum of the access frequencies with respect to the memory cells reaches the prescribed frequency, whereby the first count detection circuit and the second count detection circuit can be used as not only a counting circuit of the access frequency resulting in a so-called disturbance, in which data is lost due to reduced a quantity of polarization resulting from application of a prescribed voltage to the memory cells connected to word lines other than a selected word line, but also a counting circuit of a no-access frequency resulting in an imprint together with the third count detection circuit. Therefore, the first count detection circuit and the second count detection circuit can be used as both the counting circuit of the access frequency resulting in a disturbance and the counting circuit of the no-access frequency resulting in an imprint. Thus, the third count detection circuit detecting the frequency in which the sum of the access frequencies of each memory cell block counted by the second count detection circuit has not reached the prescribed frequency is provided, whereby the no-access frequency resulting in an imprint can be counted. Consequently, increase in circuit size can be suppressed dissimilarly to a case where a timer performing a measurement for a long time in order to measure a period during which the imprint occurs. The third count detection circuit is so formed as to detect the frequency in which the sum of the access frequencies counted by the second count detection circuit detecting the access frequency of each memory cell block has not reached the prescribed frequency. Therefore, in a case where the frequency counted by the third count detection circuit reaches the prescribed frequency, a corresponding memory cell block is not accessed for a long time. Thus, when the frequency counted by the third count detection circuit reaches the prescribed frequency, the refresh operation including the read operation and the rewrite operation is performed with respect to the memory cells of the corresponding memory cell block, whereby an imprint can be suppressed. The third count detection circuit is so formed as to detect the frequency in which the sum of the access frequencies of each memory cell block has not reached the prescribed frequency. Therefore, when the frequency counted by the third count detection circuit reaches the prescribed frequency, the refresh operation including the read operation and the rewrite operation is performed with respect to only the memory cells of the corresponding memory cell block. Thus, reduction in a period for an original access can be suppressed and increase in power consumption can be suppressed, as compared with a case where the refresh operation including the read operation and the rewrite operation is preformed with respect to the memory cells.

In the memory according to the aforementioned aspect, the refresh control circuit preferably performs a first refresh operation including a first read operation and a first rewrite operation with respect to the memory cells included in at least one of the memory cell blocks when the sum of frequencies counted by the third count detection circuit reaches a prescribed frequency. According to this structure, in a case where the refresh operation for suppressing a disturbance is performed when the sum of the access frequency counted by the second count detection circuit reaches the prescribed frequency, and the first refresh operation for suppressing an imprint is performed when the sum of the access frequency counted by the third count detection circuit reaches the prescribed frequency, the sum of the access frequency counted by the third count detection circuit does not reach the prescribed frequency when the sum of the frequency counted by the second count detection circuit reach the prescribed frequency. Therefore, the refresh operation for suppressing a disturbance is performed with respect to the memory cells while the first refresh operation for suppressing an imprint is not performed. Thus, it is possible not to perform the first refresh operation for suppressing an imprint with respect to the memory cells to which the refresh operation for suppressing a disturbance has been performed, whereby reduction in a period for an original access of the memory can be suppressed and power consumption can be further suppressed.

In this case, when the first refresh operation is performed with respect to the memory cells, data having an opposite polarity to data held in the memory cells is preferably written in the memory cells, and thereafter preferably rewritten to the data held in the memory cells. This first refresh operation is performed, whereby the memory cells in which the same data is written are not left for a long time. Thus, an imprint, in which a quantity of polarization is gradually reduced over time by leaving the memory cells in which the data are written for a long time, can be easily suppressed.

In the aforementioned memory performing the first refresh operation with respect to the memory cells, a first voltage pulse giving an electric field in a first direction and a second voltage pulse giving an electric field in a second direction opposite to the first direction are preferably applied to the memory cell selected, by the same number of times in the first refresh operation respectively. According to this structure, the pulses opposite to each other in polarity are applied to the selected memory cell by the same number of times respectively, whereby a disturbance can be suppressed, and an imprint in which a hysteresis curve is shifted in a positive or negative direction (horizontal direction) by applying a voltage pulse having the same polarity a plurality of times can be suppressed.

In the aforementioned memory performing the first refresh operation with respect to the memory cells, the refresh control circuit preferably performs a second refresh operation including a second read operation and a second rewrite operation with respect to the memory cells included in at least one of the memory cell blocks when the sum of frequencies counted by the second count detection circuit reaches a prescribed frequency, in addition to the first refresh operation. According to this structure, in a case where the first refresh operation is the refresh operation for suppressing an imprint, and the second refresh operation is the refresh operation for suppressing a disturbance, the refresh control circuit can easily selectively perform the first refresh operation for suppressing an imprint or the second refresh operation for suppressing a disturbance.

In the aforementioned memory performing the first refresh operation with respect to the memory cells, the first refresh operation is preferably a refresh operation for preventing an imprint, and the first refresh operation preferably further includes an additional cycle in which a voltage pulse having the same value as and an opposite polarity to a voltage pulse applied to the selected memory cell is applied to the selected memory cell in the first read operation. According to this structure, the sum of voltages applied to the selected memory cell can be easily set to "0", upon termination of the first read operation and the additional cycle.

In this case, the first rewrite operation preferably includes a first rewrite and a second rewrite in which voltage pulses opposite to each other in polarity are applied to the selected memory cell. According to this structure, also in the first write operation constituted by the first rewrite and the second rewrite, the sum of voltages applied to the selected memory cell can be set to "0". Thus, the sum of voltages applied to the selected memory cell can be set to "0", in a cycle of the first refresh operation constituted by the first read operation, the additional cycle, the first rewrite and the second rewrite.

In the aforementioned memory in which the first rewrite operation includes the first rewrite and the second rewrite, the selected memory cell preferably stores first data or second data, and in a case where the first data is stored in the selected memory cell, the first data is preferably rewritten in the additional cycle after the second data different from the first data is written in the first read operation, and thereafter the first rewrite and the second rewrite are preferably performed at a voltage pulse not destroying the first data. According to this structure, the first refresh operation can be easily performed and the first data can be easily rewritten in the selected memory cell.

In the aforementioned memory performing the first rewrite and the second rewrite with respect to the memory cells, the selected memory cell preferably stores first data or second data, and in a case where the second data is stored in the selected memory cell, the first data is preferably written in the additional cycle after the second data is rewritten in the first read operation, and thereafter the second data is preferably rewritten in the second rewrite after the first data is rewritten in the first rewrite. According to this structure, the first refresh operation can be easily performed, and the second data can be easily rewritten in the selected memory cell.

In the aforementioned memory performing the second refresh operation with respect to the memory cells, the second refresh operation is preferably a refresh operation for preventing a disturbance, the second rewrite operation of the second refresh operation preferably includes a third rewrite and a fourth rewrite, and voltages opposite to each other in polarity are preferably applied to the memory cells nonselected in the third rewrite and the fourth rewrite respectively. According to this structure, a disturbance phenomenon in the nonselected memory cells can be easily prevented.

In this case, no voltage pulse is preferably applied to the nonselected memory cells in the second read operation of the second refresh operation. According to this structure, the sum of voltages applied to the nonselected memory cell can be easily set to "0", in a cycle of the second refresh operation constituted by the second read operation, the third rewrite and the fourth rewrite.

In the aforementioned memory performing the first refresh operation with respect to the memory cells, the third count detection circuit is used as a counting circuit of a no-access frequency resulting in an imprint. According to this structure, the no-access frequency resulting in an imprint can be easily detected.

In this case, the refresh control circuit may include an imprint prevention/control circuit preventing the imprint by controlling the first refresh operation.

In the memory in which the aforementioned refresh control circuit controls the first refresh operation, the imprint prevention/control circuit preferably has a function of counting up the third count detection circuit of the memory cell block in which the second count detection circuit does not reach a prescribed access frequency and outputting a signal requesting the first refresh operation in a case where the third count detection circuit reaches a prescribed access frequency. According to this structure, in a case where the third count detection circuit reaches the prescribed access frequency, the first refresh operation for preventing an imprint can be easily performed.

In the aforementioned memory performing the second refresh operation with respect to the memory cells, the first count detection circuit and the second count detection circuit are preferably used as a counting circuit of an access frequency resulting in a disturbance. According to this structure, the access frequency with respect to the memory cells, and the access frequency of each memory cell block can be detected, whereby the second refresh operation can be performed when reaching the prescribed access frequency resulting in a disturbance.

In this case, the refresh control circuit may include a disturbance prevention/control circuit preventing a disturbance by controlling the second refresh operation.

In the memory in which the aforementioned refresh control circuit controls the second refresh operation, the disturbance prevention/control circuit preferably has a function of counting up the second count detection circuit and outputting a signal requesting the second refresh operation in a case where the second count detection circuit reaches a prescribed access frequency when the first count detection circuit reaches a prescribed access frequency. According to this structure, in a case where the second count detection circuit reaches the prescribed access frequency when the first count detection circuit reaches the prescribed access frequency, the second refresh operation for preventing a disturbance can be easily performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An Embodiment of the present invention will be hereinafter described with reference to the drawings. The following embodiment is described with reference to a simple matrix ferroelectric memory having memory cells formed by only single ferroelectric capacitors arranged on the intersectional positions between corresponding word lines and corresponding bit lines respectively.

Figure 1:
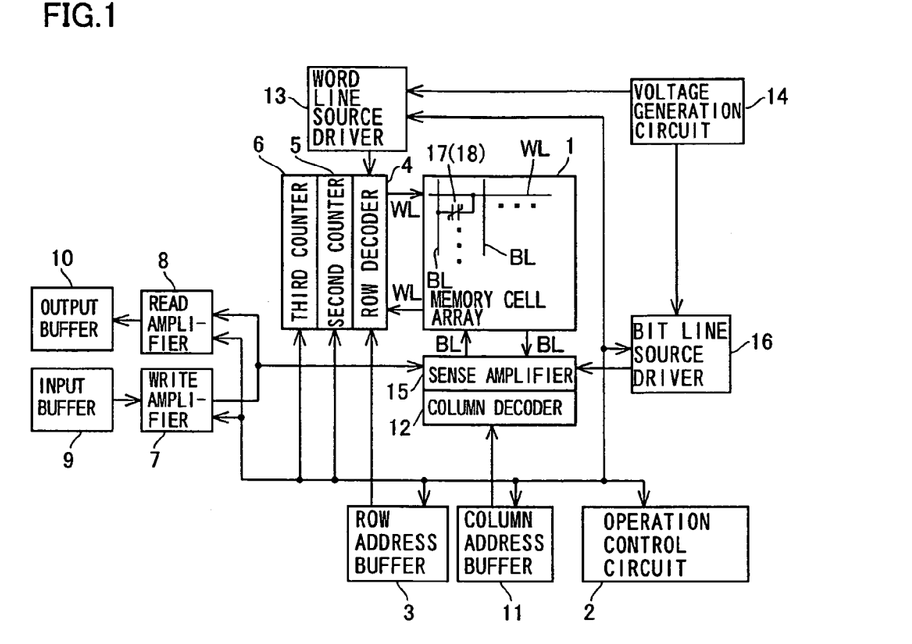
FIG. 1 is a block diagram showing an overall structure of a simple matrix ferroelectric memory according to a first embodiment of the present invention.
Figure 2:
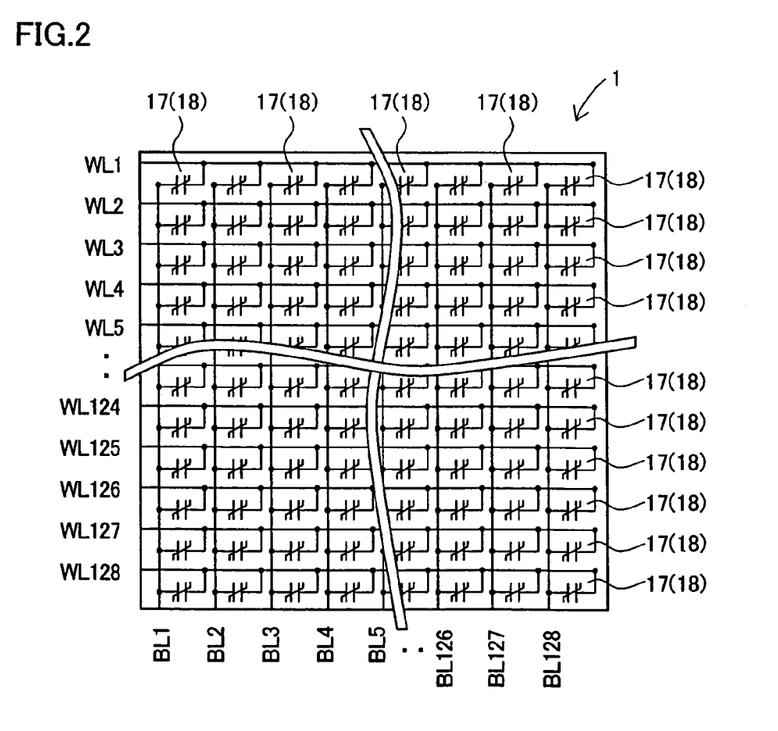
FIG. 2 is a schematic diagram for illustrating a structure of a memory cell array of the simple matrix ferroelectric memory according to the embodiment shown in FIG. 1.
Figure 3:
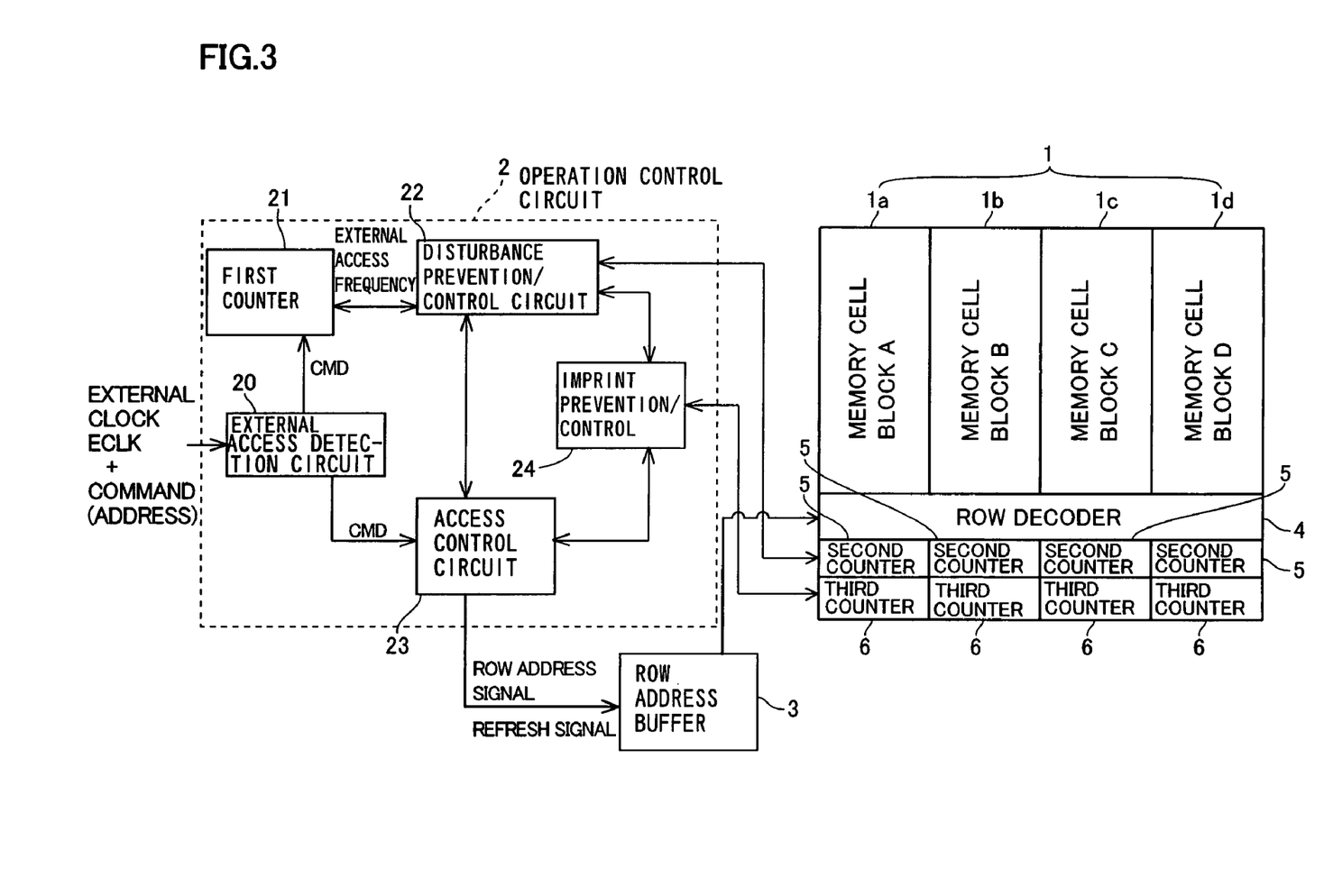
FIG. 3 is a block diagram for illustrating a structure of an operation control circuit of the simple matrix ferroelectric memory according to the embodiment shown in FIG. 1.

With reference to FIGS. 1 to 3, a structure of the simple matrix ferroelectric memory according to the embodiment of the present invention will be now described.

The simple matrix ferroelectric memory according to the embodiment comprises a memory cell array 1, an operation control circuit 2, a row address buffer 3, a row decoder 4, a second counter 5, a third counter 6, a write amplifier 7, a read amplifier 8, an input buffer 9, an output buffer 10, a column address buffer 11, a column decoder 12, a word line source driver 13, a voltage generation circuit 14, a sense amplifier 15 and a bit line source driver 16.

As shown in FIG. 2, 128 word lines WL and 128 bit lines BL, for example, are arranged on the memory cell array 1 to intersect with each other, while memory cells 18 formed by only single ferroelectric capacitors 17 are arranged on the intersectional positions between the word lines WL and the bit lines BL in the form of a matrix. The ferroelectric capacitors 17 include the corresponding word lines WL, the corresponding bit lines BL and ferroelectric films (not shown) arranged between the word lines WL and the bit lines BL. The memory cell array 1 is constituted by four memory cell blocks 1a, 1b, 1c and 1d each including a plurality of (32) word lines WL, as shown in FIG. 3. The memory cell blocks 1a, 1b, 1c and 1d are provided with second counters 5 and third counters 6 for the memory cell blocks 1a, 1b, 1c and 1d, respectively. The second counters 5 and the third counters 6 are examples of "second count detection circuit" and "third count detection circuit" in the present invention, respectively. The word lines WL (see FIG. 1) of the memory cell blocks 1a, 1b, 1c and 1d are connected to the row decoder 4. The row address buffer 3 is connected to the row decoder 4.

The operation control circuit 2 includes an external access detection circuit 20, a first counter 21, a disturbance prevention/control circuit 22, an access control circuit 23, an imprint prevention/control circuit 24 as shown in FIG. 3.

The external access detection circuit 20 has a function of outputting an external access detection pulse CMD to the first counter 21 and the access control circuit 23 when receiving an external clock ECLK through an external access operation. The external access detection circuit 20 also receives a command (address) including an external address signal corresponding to an internal address signal for an internal access operation. The first counter 21, reset upon power supply, has a function of counting up an external access frequency by +1 every time the same receives the external access detection pulse CMD from the external access detection circuit 20 and outputting the resulting external access frequency to the disturbance prevention/control circuit 22. The first counter 21 is an example of the "first count detection circuit" in the present invention.

The disturbance prevention/control circuit 22 has a function of counting up, by +1, a frequency of the second counter 5 corresponding to the memory cell block 1a, 1b, 1c or 1d accessed among these memory cell blocks 1a, 1b, 1c and 1d. The disturbance prevention/control circuit 22 has a function of monitoring the second counters 5, and when the external access frequency of the first counter 21 reaches a prescribed frequency and each frequency of the second counters 5 corresponding to the memory cell blocks 1a, 1b, 1c and 1d respectively reaches a prescribed frequency, the disturbance prevention/control circuit 22 has a function of outputting a signal requesting a disturbance preventing refresh operation to the access control circuit 23 in order to suppress the disturbance of the memory cells 18 constituting the relevant memory cell block 1a, 1b, 1c and 1d. The disturbance preventing refresh operation is an example of the "second refresh operation" in the present invention.

When the sum of the external access frequencies with respect to all memory cells 18 by the first counter 21 reaches a prescribed frequency and the sum of the access frequencies of each of the memory cell blocks 1a, 1b, 1c and 1d counted by the second counters 5 respectively does not reach a prescribed frequency, the disturbance prevention/control circuit 22 has a function of outputting a signal to the imprint prevention/control circuit 24.

According to this embodiment, there are provided the third counters 6, a frequency of each of which is counted up by +1 by the imprint prevention/control circuit 24 when a signal is inputted to the imprint prevention/control circuit 24, because of which the sum of the access frequencies of each of the memory cell blocks 1a, 1b, 1c and 1d counted by the second counters 5 respectively does not reach a prescribed frequency when the sum of the external access frequencies with respect to all memory cells 18 by the first counter 21 reaches a prescribed frequency. When a frequency of each third counter 6 reaches a prescribed frequency, the third counter 6 has a function of outputting a signal requesting an imprint preventing refresh operation to the imprint prevention/control circuit 24 in order to suppress an imprint of the memory cells 18 constituting the relevant memory cell blocks 1a, 1b, 1c and 1d. The imprint preventing refresh operation is an example of the "first refresh operation" in the present invention.

A signal from the disturbance prevention/control circuit 22 is inputted, whereby the imprint prevention/control circuit 24 has a function of counting up, by +1, frequencies of the third counters 6 corresponding to the memory cell blocks 1a, 1b, 1c and 1d, in which a frequency of the corresponding second counter 5 does not reach a prescribed frequency. The imprint prevention/control circuit 24 has a function of monitoring the third counters 6 and of outputting a signal requesting an imprint preventing refresh operation to the access control circuit 23 in order that, when the frequencies of the third counters 6 reach a prescribed frequency, an imprint of the memory cells 18 constituting the relevant memory cell blocks 1a, 1b, 1c and 1d is suppressed.

The access control circuit 23 further has a function of outputting a row address signal of an internal address signal for an internal access operation to the row address buffer 3 and outputting a column address signal of the internal address signal to the column address buffer 11. When signals requesting the disturbance preventing refresh operation and the imprint preventing refresh operation are outputted from the disturbance prevention/control circuit 22 and the imprint prevention/control circuit 24, respectively, the access control circuit 23 further has a function of outputting signals performing the disturbance preventing refresh operation and the imprint preventing refresh operation to the row decoder 4 through the row address buffer 3 (see FIG. 1), respectively.

As shown in FIG. 1, the row address buffer 3 is provided for supplying the row address signal transmitted from the operation control circuit 2 (access control circuit 23) to the decoder 4. The row decoder 4 is so formed as to activate the word line WL corresponding to a prescribed row address signal supplied from the row address buffer 3.

The write amplifier 7 and the read amplifier 8 are connected to the input buffer 9 and the output buffer 10, respectively. The column decoder 12 is connected to the column address buffer 11. The word line source driver 13 is connected to the row decoder 4. The voltage generation circuit 14 and the operation control circuit 2 are connected to the word line source driver 13. The column decoder 12 is connected to the bit lines BL of the memory cell array 1 through the sense amplifier 15. The write amplifier 7, the read amplifier 8 and the bit line source driver 16 are connected to the sense amplifier 15, while the voltage generation circuit 14 is connected to the bit line source driver 16.

Figure 4:
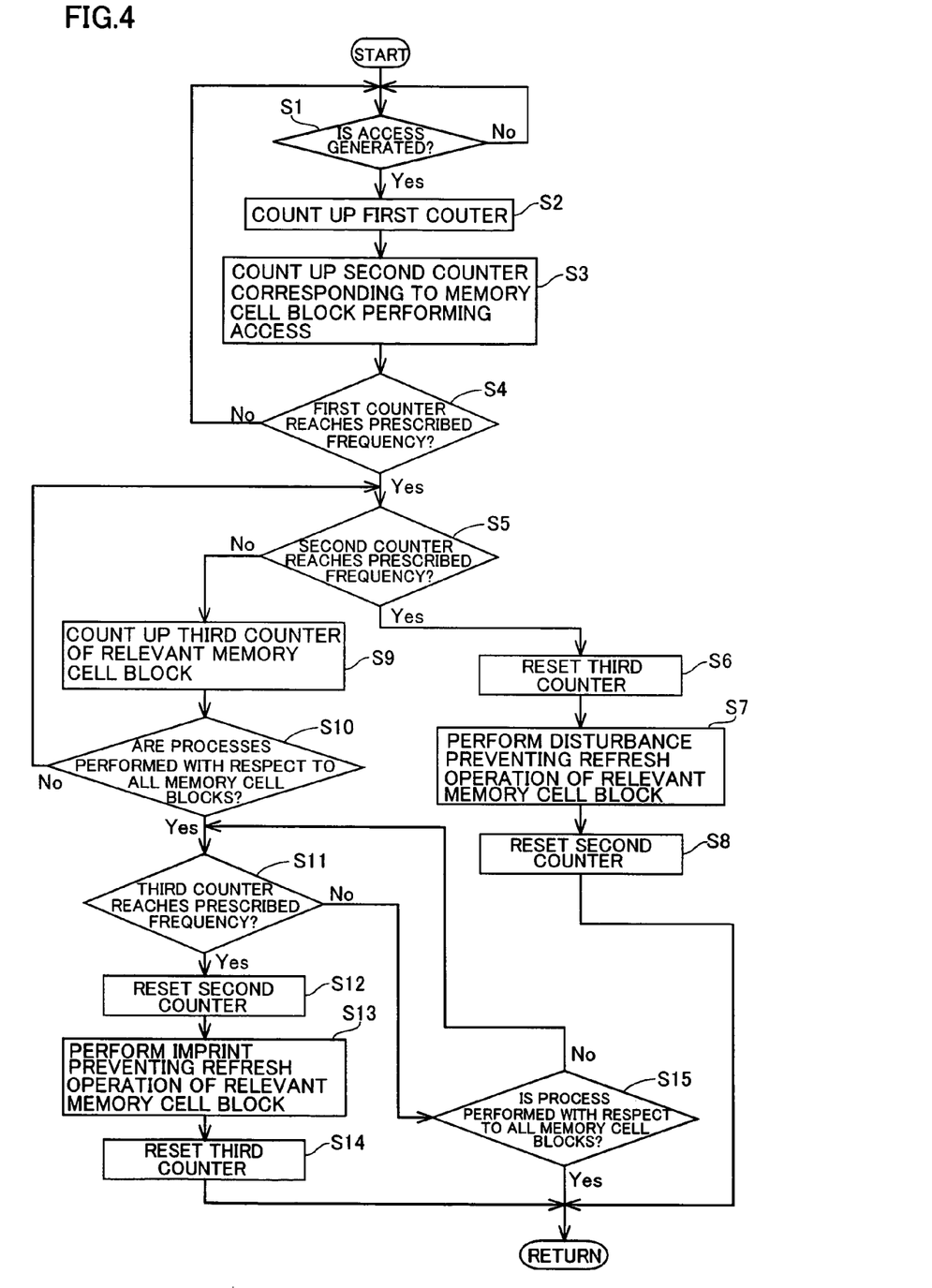
FIG. 4 is a flowchart for illustrating of a refresh operation of the simple matrix ferroelectric memory according to the embodiment of the present invention.

With reference to FIGS. 3 and 4, the refresh operation of the simple matrix ferroelectric memory according to the embodiment of the present invention will be now described.

In step S1 in FIG. 4, the external access detection circuit 20 determines whether or not an access is generated. If the external access detection circuit 20 determines that the access is not generated in step S1, the determination as to whether or not the access is generated in step S1 is repeated. On the other hand, if the external access detection circuit 20 determines that the access is generated in step S1, the external access frequency of the first counter 21 is counted up by +1 by the external access detection circuit 20 in step S2. Then, the external access frequency is outputted to the disturbance prevention/control circuit 22 by the first counter 21. The frequency of the second counter 5 corresponding to the memory cell block 1a, 1b, 1c or 1d accessed is counted up by +1 by the disturbance prevention/control circuit 22 in step S3. Thereafter, in step S4, the disturbance prevention/control circuit 22 determines whether or not the sum of the external access frequencies of the first counter 21 reaches a prescribed frequency. In step S4, if the disturbance prevention/control circuit 22 determines that the sum of the external access frequencies of the first counter 21 does not reach a prescribed frequency, the process is returned to step S1 and the processes of step S1 to step S4 are repeated.

In step S4, on the other hand, if the disturbance prevention/control circuit 22 determines that the sum of the external access frequencies of the first counter 21 reaches a prescribed frequency, the disturbance prevention/control circuit 22 determines whether or not the sum of the frequencies counted by each second counter 5 reaches a prescribed frequency in step S5. In step S5, if the disturbance prevention/control circuit 22 determines that the sum of the frequencies counted by each second counter 5 reaches a prescribed frequency, in step S6, the imprint prevention/control circuit 24 resets the third counter 6 corresponding to the memory cell block 1a, 1b, 1c or 1d, in which the frequency of the second counter 5 has reached a prescribed frequency in step S5. Then, in step S7, the disturbance prevention/control circuit 22 outputs an execution signal of the disturbance preventing refresh operation for suppressing a disturbance of the relevant memory cell block 1a, 1b, 1c or 1d to the row decoder 4 through the access control circuit 23. Thus, the disturbance preventing refresh operation for suppressing a disturbance is executed with respect to the relevant memory cell block 1a, 1b, 1c or 1d.

Then, in step S8, the disturbance prevention/control circuit 22 resets the second counter 5. Thereafter, the process is returned to step S1, and the same processes are repeated.

In step S5, on the other hand, if the disturbance prevention/control circuit 22 determines that the sum of the frequencies counted by each second counter 5 does not reach a prescribed frequency, the imprint prevention/control circuit 24 counts up, by +1, a frequency of the third counter 6 corresponding to the relevant memory cell block 1a, 1b, 1c or 1d in step S9. In step S10, the imprint prevention/control circuit 24 determines whether or not the processes of step S5 and step S9 have been executed with respect to all memory cell blocks 1a, 1b, 1c and 1d. Specifically, in step S10, the imprint prevention/control circuit 24 determines whether or not the determination in step S5 and the count-up process of each third counter 6 in step S9 have been executed with respect to all memory cell blocks 1a, 1b, 1c and 1d. In step S10, if the imprint prevention/control circuit 24 determines that the processes of step S5 and step S9 have been not executed with respect to all memory cell blocks 1a, 1b, 1c and 1d, the process is returned to step S5, and the same processes are repeated.

In step S10, on the other hand, if the imprint prevention/control circuit 24 determines that the processes of step S5 and step S9 have been executed with respect to all memory cell blocks 1a, 1b, 1c and 1d, the imprint prevention/control circuit 24 determines whether or not the sum of the frequencies counted by each third counter 6 reaches a prescribed frequency in step S11. If the imprint prevention/control circuit 24 determines that the sum of the frequencies counted by each third counter 6 reaches a prescribed frequency in step S11, since the relevant memory cell block 1a, 1b, 1c or 1d is not accessed for a long time, the imprint prevention/control circuit 24 resets the second counter 5 corresponding to the relevant memory cell block 1a, 1b, 1c or 1d through the disturbance prevention/control circuit 22 in step S12, and thereafter the imprint prevention/control circuit 24 outputs an execution signal of the imprint preventing refresh operation for suppressing an imprint of the relevant memory cell block 1a, 1b, 1c or 1d to the row decoder 4 through the access control circuit 23 in step S13. Thus, the imprint preventing refresh operation for suppressing an imprint is executed with respect to the memory cell block 1a, 1b, 1c or 1d not accessed for a long time. A no-access frequency resulting in an imprint is counted by the first counter 21 and the second counter 5 counting an access frequency resulting in a disturbance and the third counter 6. Thereafter, in step S14, the imprint prevention/control circuit 24 resets the third counter 6 of the memory cell block 1a, 1b, 1c or 1d in which the imprint preventing refresh operation has been performed in step S13. Then, the process is returned to step S1, and the same processes are repeated.

On the other hand, if the imprint prevention/control circuit 24 determines that the sum of the frequencies counted by each third counter 6 does not reach a prescribed frequency in step S11, the imprint prevention/control circuit 24 determines whether or not the process of step S1 has been performed with respect to all memory cell blocks 1a, 1b, 1c and 1d in step S15. Specifically, in step S15, the imprint prevention/control circuit 24 determines, whether or not the determination as to whether the sum of the frequencies counted by the third counter 6 corresponding to each of the memory cell blocks 1a, 1b, 1c and 1d reaches a prescribed frequency is performed with respect to all memory cell blocks 1a, 1b, 1c and 1d. If the imprint prevention/control circuit 24 determines that the process of step S11 is not executed with respect to all memory cell blocks 1a, 1b, 1c and 1d in step S15, the process is returned to step S11 and the same process is repeated. In step S15 on the other hand, if the imprint prevention/control circuit 24 determines that the process of step S11 is executed with respect to all memory cell blocks 1a, 1b, 1c and 1d, the process is returned to step S1 and the same processes are repeated.

Figure 5:
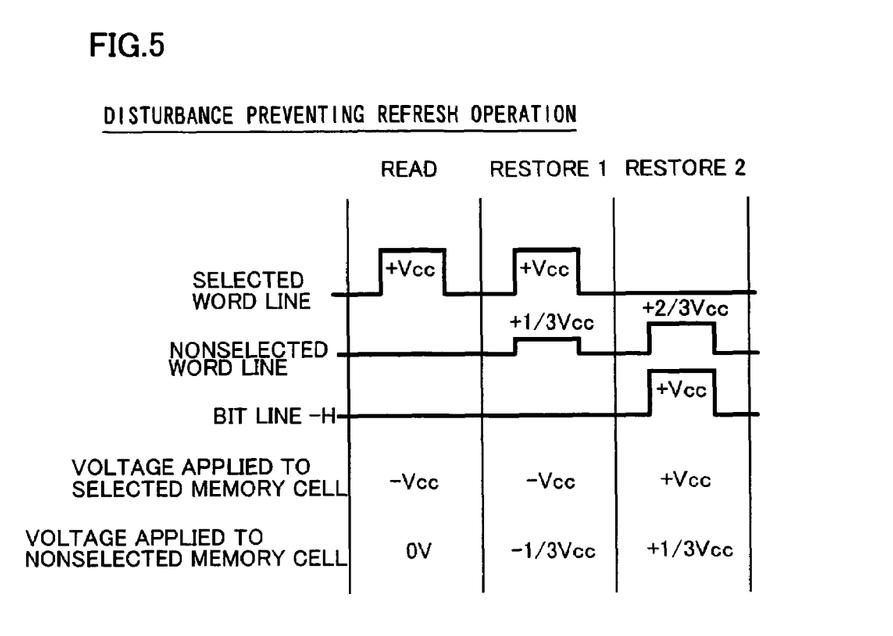
FIGS. 5 and 6 are voltage waveform diagrams for illustrating a disturbance preventing refresh operation of the simple matrix ferroelectric memory according to the embodiment of the present invention.
Figure 6:
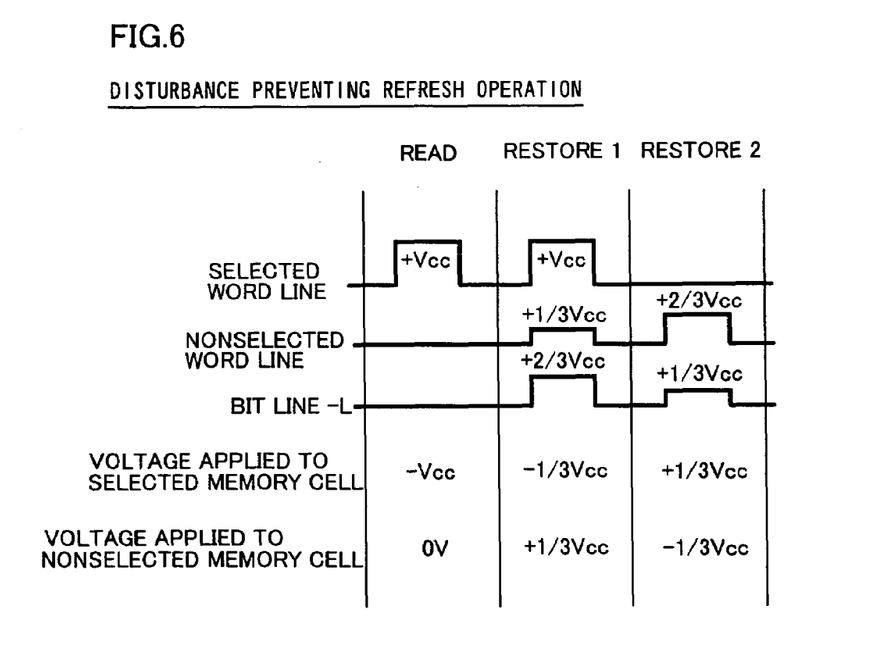

With reference to FIGS. 5 and 6, the disturbance preventing refresh operation of the simple matrix ferroelectric memory according to the embodiment of the present invention will be now described. FIG. 5 is a voltage waveform diagram of a disturbance preventing refresh operation in a case of wiring data "H" in a selected memory cell 18, while FIG. 6 is a voltage waveform diagram of a disturbance preventing refresh operation in a case of wiring data "L" in a selected memory cell 18.

The ferroelectric memory continuously performs three cycles of a read operation (READ), a rewrite 1 (RESTORE 1) and a rewrite 2 (RESTORE 2) in the disturbance preventing refresh operation, as shown in FIGS. 5 and 6. More specifically, the ferroelectric memory applies a voltage +Vcc to a selected word line WL corresponding to the row address signal of the internal address signal while applying no voltage to the bit lines BL, thereby collectively reading data stored in all memory cells 18 linked to the selected word line WL through the corresponding bit lines BL with the sense amplifier 15 (see FIG. 1), as shown in FIGS. 5 and 6. In this read operation, the ferroelectric memory applies a voltage −Vcc, to write data "L" in all memory cells 18 linked to the selected word line WL. In the read operation, the ferroelectric memory applies no voltage to nonselected word lines WL and bit lines BL, thereby applying no voltage to the nonselected memory cells 18 linked to the nonselected word lines WL. The read operation (READ) in the disturbance preventing refresh operation is an example of the "second read operation" in the present invention, and a continuous operation of the rewrite 1 (RESTORE 1) and the rewrite 2 (RESTORE 2) is an example of the "second rewrite operation" in the present invention.

Next, the ferroelectric memory applies the voltage +Vcc to the memory cells 18, from which data "H" have been read, among those linked to the selected word line WL while applying no voltage to the bit lines BL thereby rewriting data "L" in these memory cells 18 in the rewrite 1 (RESTORE 1), as shown in FIG. 5. Thereafter the ferroelectric memory applies the voltage +Vcc to the bit lines BL from which data "H" have been read while applying no voltage to the selected word line WL thereby writing data "H" in the memory cells 18 in the rewrite 2 (RESTORE 2). In the rewrite 1 (RESTORE 1) on the memory cells 18 from which data "H" have been read, the ferroelectric memory applies a voltage +1/3 Vcc to nonselected word lines WL while applying no voltage to the bit lines BL from which data "H" have been read. Thus, the ferroelectric memory applies a voltage −1/3 Vcc to the nonselected memory cells 18 connected to the nonselected word lines WL and the bit lines BL from which data "H" have been read in the rewrite 1 (RESTORE 1). In the rewrite 2 (RESTORE 2), the ferroelectric memory applies a voltage +2/3 Vcc to the nonselected word lines WL while applying the voltage +Vcc to the bit lines BL from which data "H" have been read. Thus, the ferroelectric memory applies the voltage +1/3 Vcc to the memory cells 18 connected to the nonselected word lines WL and the bit lines BL from which data "H" have been read in the rewrite 2 (RESTORE 2). Therefore, the ferroelectric memory applies no voltage exceeding 1/3 Vcc to the nonselected memory cells 18 connected to the nonselected word lines WL and the bit lines BL from which data "H" have been read as an absolute value, while applying the voltages −1/3 Vcc and +1/3 Vcc generated in the rewrite 1 (RESTORE 1) and the rewrite 2 (RESTORE 2) respectively to cancel each other.

On the other hand, the ferroelectric memory has read data from and simultaneously written data "L" in the memory cells 18 from which data "L" have been read among those linked to the selected word line WL through the aforementioned read operation (READ), as shown in FIG. 6. Therefore, the ferroelectric memory so performs the rewrite 1 (RESTORE 1) and the rewrite 2 (RESTORE 2) as to apply a voltage 1/3 Vcc to the selected word line WL as a voltage value (absolute value) not destroying the data "L" written in the memory cells 18. More specifically, the ferroelectric memory applies the voltage +Vcc to the selected word line WL while applying the voltage +2/3 Vcc to the bit lines BL from which data "L" have been read in the rewrite 1 (RESTORE 1) with respect to the memory cells 18 of the selected word line WL. In the rewrite 2 (RESTORE 2), the ferroelectric memory applies no voltage to the selected word line WL while applying the voltage +1/3 Vcc to the bit lines BL from which data "L" have been read. In the rewrite 1 (RESTORE 1) with respect to the memory cells 18 from which data "L" have been read, the ferroelectric memory applies the voltage +1/3 Vcc to the nonselected word lines WL while applying the voltage +2/3 Vcc to the bit lines BL from which data "L" have been read. Thus, only the voltage +1/3 Vcc appears in the memory cells 18 connected to the nonselected word lines WL and the bit lines BL from which data "L" have been read in the rewrite 1 (RESTORE 1). In the rewrite 2 (RESTORE 2), the ferroelectric memory applies the voltage +2/3 Vcc to the nonselected word lines WL while applying the voltage +1/3 Vcc to the bit lines BL from which data "L" have been read. Thus, the ferroelectric memory applies the voltage −1/3 Vcc to the memory cells 18 connected to the nonselected word lines WL and the bit lines BL from which data "L" have been read in the rewrite 2 (RESTORE 2). Therefore, the ferroelectric memory applies no voltage exceeding 1/3 Vcc to the memory cells 18 connected to the nonselected word lines WL and the bit line BL from which data "L" have been read as an absolute value, while applying the voltages +1/3 Vcc and −1/3 Vcc generated in the rewrite 1 (RESTORE 1) and the rewrite 2 (RESTORE 2) respectively to cancel each other.

Figure 7:
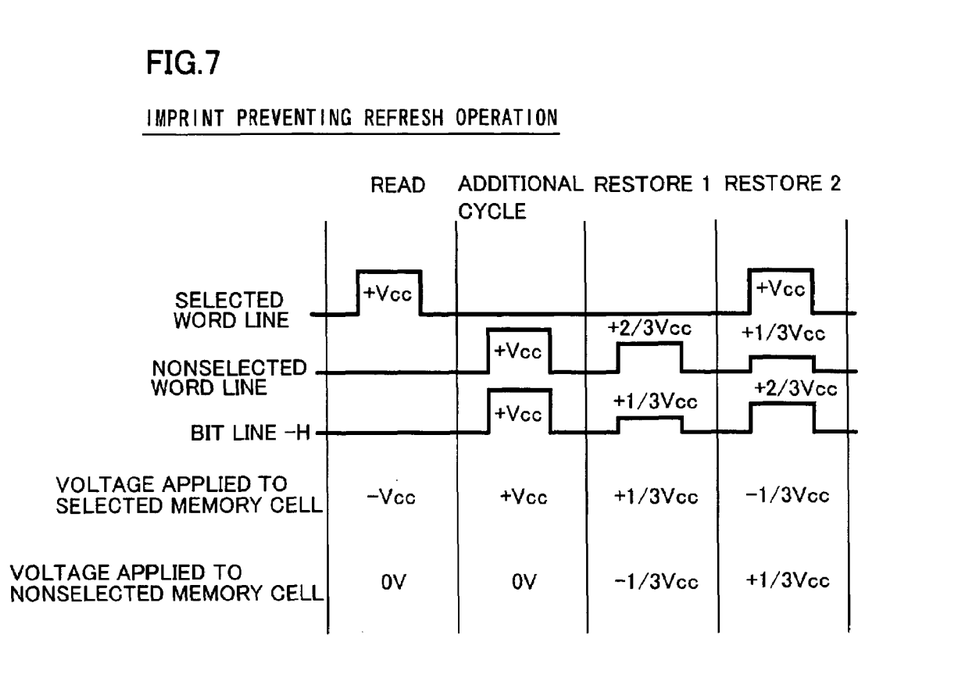
FIGS. 7 and 8 are voltage waveform diagrams for illustrating an imprint preventing refresh operation of the simple matrix ferroelectric memory according to the embodiment of the present invention.
Figure 8:
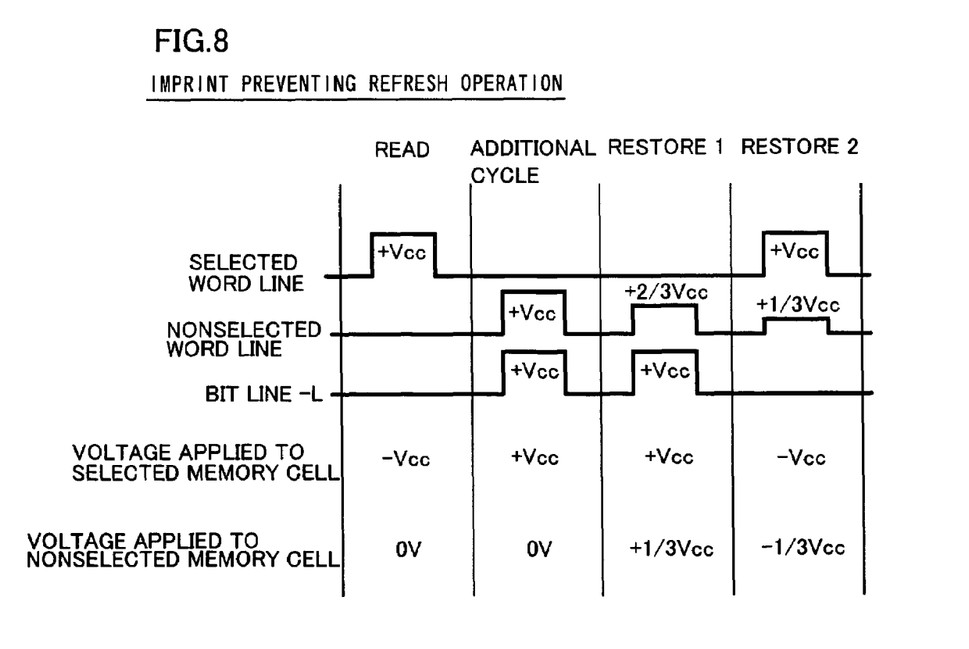

With reference to FIGS. 7 and 8, the imprint preventing refresh operation of the simple matrix ferroelectric memory according to the embodiment of the present invention will be now described. FIG. 7 is a voltage waveform diagram of an imprint preventing refresh operation in a case of wiring data "H" in a selected memory cell 18, while FIG. 8 is a voltage waveform diagram of an imprint preventing refresh operation in a case of wiring data "L" in a selected memory cell 18.

The ferroelectric memory continuously performs a read operation (READ), an additional cycle added by the imprint prevention/control circuit 24, a rewrite 1 (RESTORE 1) and a rewrite 2 (RESTORE 2) in the imprint preventing refresh operation, as shown in FIGS. 7 and 8. More specifically, the ferroelectric memory applies a voltage +Vcc to a selected word line WL corresponding to the row address signal of the internal address signal while applying no voltage to bit lines BL, thereby collectively reading data stored in all memory cells 18 linked to the selected word line WL through corresponding bit lines BL, and thereafter reads data stored in a selected memory cell 18 corresponding to a column address signal with the column decoder 12 (see FIG. 1) in the read operation (READ), as shown in FIGS. 7 and 8. In this read operation, the ferroelectric memory applies a voltage −Vcc to write data "L" in all memory cells 18 linked to the selected word line WL. In the read operation, the ferroelectric memory applies no voltage to nonselected word lines WL and bit lines BL, thereby applying no voltage to nonselected memory cells 18 linked to the nonselected word lines WL. Then, the ferroelectric memory performs the additional cycle so that the sum of voltages applied to the selected word line WL reaches zero in a cycle of the imprint preventing refresh operation. In this additional cycle, the ferroelectric memory applies the voltage +Vcc to the bit lines BL while applying no voltage to the selected word line WL. The ferroelectric memory applies the same voltage +Vcc as that applied to the bit lines BL in the additional cycle, to apply no voltage to nonselected word lines WL. The read operation (READ) in the imprint preventing refresh operation is an example of the "first read operation" in the present invention, and a continuous operation of the additional cycle, the rewrite 1 (RESTORE 1) and the rewrite 2 (RESTORE 2) is an example of the "first rewrite operation" in the present invention.

The ferroelectric memory has written data "H" in the memory cells 18 from which data "H" (data "1") have been read among those linked to the selected word line WL in the aforementioned additional cycle, as shown in FIG. 7. Therefore, the ferroelectric memory so performs the rewrite 1 (RESTORE 1) and the rewrite 2 (RESTORE 2) as to apply a voltage 1/3 Vcc to the selected word line WL as a voltage value (absolute value) not destroying the data "H" written in the memory cells 18. More specifically, the ferroelectric memory applies no voltage to the selected word line WL while applying a voltage +1/3 Vcc to the bit lines BL from which data "H" have been read in the rewrite 1 (RESTORE 1). Then, in the rewrite 2 (RESTORE 2), the ferroelectric memory applies the voltage +Vcc to the selected word line WL while applying a voltage +2/3 Vcc to the bit lines BL from which data "H" have been read. Therefore, the ferroelectric memory applies the voltages to the memory cells 18 connected to the selected word line WL so that −Vcc and +Vcc applied in the read operation (READ) and the additional cycle respectively cancel each other and +1/3 Vcc and −1/3 Vcc applied in the rewrite 1 (RESTORE 1) and the rewrite 2 (RESTORE 2) respectively cancel each other. Thus, the ferroelectric memory can set the sum of the voltages applied to the selected memory cells 18 connected to the selected word line WL in a single imprint preventing refresh operation to "0". The +Vcc applied in the additional cycle and the +1/3 Vcc applied in the rewrite 1 (RESTORE 1) are examples of the "first voltage pulse" in the present invention respectively, and the −Vcc applied in the read operation (READ) and the −1/3Vcc applied in the rewrite 2 (RESTORE 2) are examples of the "second voltage pulse" in the present invention respectively.

In the rewrite 1 (RESTORE 1) on the memory cells 18 from which data "H" have been read, the ferroelectric memory applies the voltage +2/3 Vcc to the nonselected word lines WL while applying the voltage +1/3 Vcc to the bit lines BL from which data "H" have been read, as shown in FIG. 7. Thus, the ferroelectric memory applies the voltage −1/3 Vcc to the memory cells 18 connected to the nonselected word lines WL and the bit lines BL from which data "H" have been read in the rewrite 1 (RESTORE 1). In the rewrite 2 (RESTORE 2), the ferroelectric memory applies the voltage +1/3 Vcc to the nonselected word lines WL while applying the voltage +2/3 Vcc to the bit lines BL from which data "H" have been read. Thus, only the voltage +1/3Vcc appears in the memory cells 18 connected to the nonselected word lines WL and the bit lines BL from which data "H" have been read in the rewrite 2 (RESTORE 2). Therefore, the ferroelectric memory applies no voltage exceeding 1/3 Vcc to the memory cells 18 connected to the nonselected word lines WL and the bit lines BL from which data "H" have been read as an absolute value, while applying the voltages −1/3 Vcc and +1/3 Vcc generated in the rewrite 1 (RESTORE 1) and the rewrite 2 (RESTORE 2) respectively to cancel each other.

With respect to memory cells 18 from which data "L" (Data "0") has been read among those linked to the selected word line WL, on the other hand, the ferroelectric memory applies the voltage +Vcc to the bit lines BL from which data "L" have been read while applying no voltage to the selected word line WL, thereby writing data "H" in these memory cells 18 in the rewrite 1 (RESTORE 1), as shown in FIG. 8. In the rewrite 2 (RESTORE 2), the ferroelectric memory applies the voltage +Vcc to the selected word line WL while applying no voltage to the bit lines BL from which data "L" have been read, thereby writing data "L" in the memory cells 18 connected to the selected word line WL and the bit lines BL from which data "L" have been read. Therefore, the ferroelectric memory applies the voltages to the memory cells 18 connected to the selected word line WL and the bit lines BL from which data "L" have been read so that −Vcc and +Vcc applied in the read operation (READ) and the additional cycle respectively cancel each other and +Vcc and −Vcc applied in the rewrite 1 (RESTORE 1) and the rewrite 2 (RESTORE 2) respectively cancel each other. Thus, the ferroelectric memory can set the sum of the voltages applied to the memory cells 18 connected to the selected word line WL to "0" in a single imprint preventing refresh operation. The +Vcc applied in the additional cycle and the +Vcc applied in the rewrite 1 (RESTORE 1) are examples of the "first voltage pulse" in the present invention respectively, and the −Vcc applied in the read operation (READ) and the −Vcc applied in the rewrite 2 (RESTORE 2) are examples of the "second voltage pulse" in the present invention respectively.

With respect to the memory cells 18 from which data "L" have been read, the ferroelectric memory applies the voltage +1/3 Vcc to the nonselected word lines WL while applying the voltage +Vcc to the bit lines BL from which data "L" have been read in the rewrite 1 (RESTORE 1). Thus, only the voltage +1/3 Vcc appears in the memory cells 18 connected to the nonselected word lines WL and the bit lines BL from which data "L" have been read in the rewrite 1 (RESTORE 1). In the second rewrite 2 (RESTORE 2), the ferroelectric memory applies the voltage +1/3 Vcc to the nonselected word lines WL while applying no voltage to the bit lines BL from which data "L" have been read. Thus, the ferroelectric memory applies the voltage −1/3 Vcc to the memory cells 18 connected to the nonselected word lines WL and the bit lines BL from which data "L" have been read in the rewrite 2 (RESTORE 2). Therefore, the ferroelectric memory applies no voltage exceeding 1/3 Vcc to the memory cells 18 connected to the nonselected word lines WL and the bit lines BL from which data "L" have been read as an absolute value, while applying the voltages +1/3 Vcc and −1/3 Vcc generated in the rewrite 1 (RESTORE 1) and the rewrite 2 (RESTORE 2) respectively to cancel each other.

According to this embodiment, as hereinabove described, there are provided the third counters 6 each detecting a frequency in which the sum of the access frequencies of each of the memory cell blocks 1a, 1b, 1c and 1d counted by the corresponding second counters 5 has not reached a prescribed frequency when the first counter 21 detects that the sum of the access frequencies with respect to all memory cells 18 reaches a prescribed frequency, whereby the first counter 21 and the second counter 5 can be used as not only a counting circuit of the access frequency resulting in the so-called disturbance, in which data is lost due to reduced quantities of polarization resulting from application of a prescribed voltage to the memory cells 18 connected to word lines WL other than a selected word line, but also a counting circuit of a no-access frequency resulting an imprint together with the third counter 6. Therefore, the first counter 21 and the second counter 5 can be used as both the counting circuit of the access frequency resulting in a disturbance and the counting circuit of the no-access frequency resulting in an imprint. Thus, the third counters 6 each detecting the frequency in which the sum of each of the access frequencies of each of the memory cell blocks 1a, 1b, 1c and 1d counted by the corresponding second counters 5 has not reached a prescribed frequency is provided, whereby the no-access frequency resulting in the imprint can be counted. Consequently, increase in circuit size can be suppressed dissimilarly to a case where a timer performing a measurement for a long time in order to measure a period during which the imprint occurs.

According to this embodiment, each third counter 6 is so formed as to detect the frequency (no-access frequency) in which the sum of the access frequencies counted by the second counter 5 counting the access frequency of each of the memory cell blocks 1a, 1b, 1c and 1d has not reached a prescribed frequency. Therefore, in a case where the frequency counted by each third counter 6 reaches a prescribed frequency, the corresponding memory cell blocks 1a, 1b, 1c and 1d are not accessed. Thus, when the frequency counted by each third counters 6 reach a prescribed frequency, the imprint preventing refresh operation is performed with respect to the memory cells 18 of the corresponding memory cell blocks 1a, 1b, 1c and 1d, whereby an imprint can be suppressed.

According to this embodiment, each third counter 6 is so formed as to detect the frequency in which the sum of the access frequencies of each of the memory cell blocks 1a, 1b, 1c and 1d has not reached a prescribed frequency. Therefore, when the frequency counted by each third counter 6 reaches a prescribed frequency, the imprint preventing refresh operation is performed with respect to only the memory cells 18 of the corresponding memory cell blocks 1a, 1b, 1c and 1d. Thus, reduction in a period for an original access and increase in power consumption can be suppressed, as compared with a case where the imprint preventing refresh operation is preformed with respect to all memory cells.

According to this embodiment, when the imprint prevention/control circuit 24 and the access control circuit 23 are so formed that the imprint preventing refresh operation is performed with respect to the memory cells 18 included in at least one of the memory cell blocks 1a, 1b, 1c and 1d, when the sum of the frequencies counted by each third counter 6 reaches a prescribed frequency. Therefore, when the sum of the frequencies counted by the second counter 5 reaches a prescribed frequency, the sum of the access frequencies counted by the third counter 6 do not reach a prescribed frequency, whereby the disturbance preventing refresh operation is performed with respect to the memory cells 18 while the imprint preventing refresh operation is not performed. Thus, it is possible not to perform the imprint preventing refresh operation with respect to the memory cells 18 with respect to which the disturbance preventing refresh operation has been performed, whereby reduction in a period for an original access of the memory can be suppressed and power consumption can be further suppressed.

According to this embodiment, when the imprint preventing refresh operation is performed with respect to the memory cells 18, data having an opposite polarity to data held in the memory cells 18 is written in the memory cells 18, and thereafter the data held in the memory cells 18 is rewritten. Thus, the memory cells 18 in which the same data is written are not left for a long time by performing the refresh operation with respect to the memory cells 18, whereby an imprint, in which a quantity of polarization is gradually reduced over time by leaving the memory cells 18 in which the data is written for a long time, can be easily suppressed.

According to this embodiment, in the imprint preventing refresh operation, a positive voltage pulse and a negative voltage pulse are applied to a selected memory cell 18 the same number of times respectively. Thus, the pulses opposite to each other in polarity are applied to the selected memory cell 18 the same number of times respectively, whereby a disturbance can be suppressed, and an imprint in which a hysteresis curve is shifted in a positive or negative direction (horizontal direction) by applying a voltage pulse having the same polarity a plurality of times can be suppressed.

According to this embodiment, the memory is so formed that the disturbance preventing refresh operation is performed with respect to the memory cells 18 included in at least one of the memory cell blocks 1a, 1b, 1c and 1d when the sum of the frequencies counted by the second counter 5 reaches a prescribed frequency in addition to the imprint preventing refresh operation. Thus, an imprint of the memory cells 18 can be easily suppressed, and a disturbance of the memory cells 18 can be easily suppressed.

What is claimed is:

1. A memory comprising:
   a plurality of memory cell blocks each including a plurality of memory cells;

a refresh control circuit for performing a read operation and a rewrite operation with respect to said memory cells;

a first count detection circuit for detecting an access frequency with respect to said memory cells;

a second count detection circuit for detecting an access frequency of each said memory cell block; and a third count detection circuit detecting a frequency in which the sum of access frequencies of each said memory cell block counted by said second count detection circuit has not reached a prescribed frequency when said first count detection circuit detects that the sum of access frequencies with respect to said memory cells reaches a prescribed frequency.

2. The memory according to claim 1, wherein said refresh control circuit performs a first refresh operation including a first read operation and a first rewrite operation with respect to said memory cells included in at least one of said memory cell blocks when the sum of frequencies counted by said third count detection circuit reaches a prescribed frequency.

3. The memory according to claim 2, wherein when said first refresh operation is performed with respect to said memory cells, data having an opposite polarity to data held in said memory cells is written in said memory cells, and thereafter rewritten to said data held in said memory cells.

4. The memory according to claim 2, wherein a first voltage pulse giving an electric field in a first direction and a second voltage pulse giving an electric field in a second direction opposite to said first direction are applied to selected said memory cell by the same number of times in said first refresh operation respectively.

5. The memory according to claim 2, wherein said refresh control circuit performs a second refresh operation including a second read operation and a second rewrite operation with respect to said memory cells included in at least one of said memory cell blocks when the sum of frequencies counted by said second count detection circuit reaches a prescribed frequency, in addition to said first refresh operation.

6. The memory according to claim 2, wherein said first refresh operation is a refresh operation for preventing an imprint, and said first refresh operation further includes an additional cycle in which a voltage pulse having the same value as and an opposite polarity to a voltage pulse applied to said selected memory cell is applied to said selected memory cell in said first read operation.

7. The memory according to claim 6, wherein said first rewrite operation includes a first rewrite and a second rewrite in which voltage pulses opposite to each other in polarity are applied to said selected memory cell.

8. The memory according to claim 7, wherein said selected memory cell stores first data or second data, and in a case where said first data is stored in said selected memory cell, said first data is rewritten in said additional cycle after said second data different from said first data is written in said first read operation, and thereafter said first rewrite and said second rewrite are performed at a voltage pulse not destroying said first data.

9. The memory according to claim 7, wherein said selected memory cell stores first data or second data, and in a case where said second data is stored in said selected memory cell, said first data is written in said additional cycle after said second data is rewritten in said first read operation, and thereafter said second data is rewritten in said second rewrite after said first data is rewritten in said first rewrite.

10. The memory according to claim 5, wherein said second refresh operation is a refresh operation for preventing a disturbance, said second rewrite operation of said second refresh operation includes a third rewrite and a fourth rewrite, and voltages opposite to each other in polarity are applied to nonselected said memory cells in said third rewrite and said fourth rewrite respectively.

11. The memory according to claim 10, wherein no voltage pulse is applied to said nonselected memory cells in said second read operation of said second refresh operation.

12. The memory according to claim 2, wherein said third count detection circuit is used as a counting circuit of a no-access frequency resulting in an imprint.

13. The memory according to claim 12, wherein said refresh control circuit includes an imprint prevention/control circuit preventing said imprint by controlling said first refresh operation.

14. The memory according to claim 13, wherein said imprint prevention/control circuit has a function of counting up said third count detection circuit of said memory cell block in which said second count detection circuit does not reach a prescribed access frequency and outputting a signal requesting said first refresh operation in a case where said third count detection circuit reaches a prescribed access frequency.

15. The memory according to claim 5, wherein said first count detection circuit and said second count detection circuit are used as a counting circuit of an access frequency resulting in a disturbance.

16. The memory according to claim 15, wherein said refresh control circuit includes a disturbance prevention/control circuit preventing said disturbance by controlling said second refresh operation.

17. The memory according to claim 16, wherein said disturbance prevention/control circuit has a function of counting up said second count detection circuit and outputting a signal requesting said second refresh operation in a case where said second count detection circuit reaches a prescribed access frequency when said first count detection circuit reaches a prescribed access frequency.

* * * * *